(12) United States Patent
Anthis et al.

(10) Patent No.: US 10,643,840 B2
(45) Date of Patent: May 5, 2020

(54) SELECTIVE DEPOSITION DEFECTS REMOVAL BY CHEMICAL ETCH

(71) Applicant: Applied Materials, Inc., Santa Clara, CA (US)

(72) Inventors: Jeffrey W. Anthis, San Jose, CA (US); Chang Ke, Sunnyvale, CA (US); Pratham Jain, Santa Clara, CA (US); Benjamin Schmiege, Santa Clara, CA (US); Guoqiang Jian, San Jose, CA (US); Michael S. Jackson, Sunnyvale, CA (US); Lei Zhou, San Jose, CA (US); Paul F. Ma, Santa Clara, CA (US); Liqi Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 51 days.

(21) Appl. No.: 16/129,223

(22) Filed: Sep. 12, 2018

(65) Prior Publication Data

US 2019/0080904 A1 Mar. 14, 2019

Related U.S. Application Data

(60) Provisional application No. 62/557,734, filed on Sep. 12, 2017.

(51) Int. Cl.
*H01L 21/02* (2006.01)
*H01L 21/311* (2006.01)
*H01L 21/033* (2006.01)
*H01L 21/3105* (2006.01)
*H01L 21/67* (2006.01)
*H01L 21/32* (2006.01)

(52) U.S. Cl.
CPC .. *H01L 21/02334* (2013.01); *H01L 21/02172* (2013.01); *H01L 21/02271* (2013.01); *H01L 21/0337* (2013.01); *H01L 21/3105* (2013.01); *H01L 21/31116* (2013.01); *H01L 21/32* (2013.01); *H01L 21/67288* (2013.01)

(58) Field of Classification Search
None
See application file for complete search history.

(56) References Cited

U.S. PATENT DOCUMENTS

| 4,871,651 | A | * | 10/1989 | McCune, Jr. | G03F 7/40 430/315 |
| 5,062,898 | A | * | 11/1991 | McDermott | B08B 3/12 134/7 |
| 5,378,312 | A | * | 1/1995 | Gifford | B08B 7/0092 134/7 |

(Continued)

OTHER PUBLICATIONS

PCT International Search Report and Written Opinion in PCT/US2018/050655 dated Jan. 4, 2019, 11 pages.

*Primary Examiner* — David E Graybill
(74) *Attorney, Agent, or Firm* — Servilla Whitney LLC

(57) ABSTRACT

Methods of depositing a film selectively onto a first substrate surface relative to a second substrate surface are described. The methods include exposing a substrate to a blocking molecule to selectively deposit a blocking layer on the first surface. A layer is selectively formed on the second surface and defects of the layer are formed on the blocking layer. The defects are removed from the blocking layer on the first surface.

20 Claims, 1 Drawing Sheet

(56) References Cited

U.S. PATENT DOCUMENTS

| | | | | |
|---|---|---|---|---|
| 5,976,264 A * | 11/1999 | McCullough | B08B 7/0021 | 134/2 |
| 6,500,758 B1 * | 12/2002 | Bowers | H01L 21/32131 | 257/E21.306 |
| 7,066,789 B2 * | 6/2006 | Tannous | B08B 5/02 | 134/9 |
| 8,197,603 B2 * | 6/2012 | Jackson | B08B 7/0021 | 134/1.2 |
| 8,293,658 B2 * | 10/2012 | Shero | B82Y 30/00 | 438/763 |
| 8,575,021 B2 * | 11/2013 | Boussie | H01L 21/7685 | 257/E21.26 |
| 9,368,400 B2 * | 6/2016 | Boussie | B82Y 30/00 | |
| 9,673,042 B2 * | 6/2017 | Visser | H01L 21/76834 | |
| 9,875,907 B2 * | 1/2018 | Wang | H01L 21/02164 | |
| 9,895,715 B2 * | 2/2018 | Haukka | C23C 18/122 | |
| 9,997,373 B2 * | 6/2018 | Hudson | H01J 37/32513 | |
| 10,192,752 B2 * | 1/2019 | Kaufman-Osborn | H01L 21/32 | |
| 10,366,878 B2 * | 7/2019 | Kachian | H01L 21/02118 | |
| 10,428,421 B2 * | 10/2019 | Haukka | C23C 16/405 | |
| 10,480,064 B2 * | 11/2019 | Longrie | C23C 16/02 | |
| 2005/0127038 A1 * | 6/2005 | Tannous | B08B 5/02 | 216/62 |
| 2006/0278254 A1 * | 12/2006 | Jackson | B08B 7/0021 | 134/21 |
| 2011/0198736 A1 * | 8/2011 | Shero | B82Y 30/00 | 257/629 |
| 2013/0217238 A1 * | 8/2013 | Boussie | H01L 21/7685 | 438/761 |
| 2014/0217592 A1 * | 8/2014 | Ou | H01L 23/5226 | 257/751 |
| 2015/0137333 A1 * | 5/2015 | Marsh | C23C 16/0227 | 257/637 |
| 2015/0179500 A1 * | 6/2015 | Boussie | B82Y 30/00 | 438/674 |
| 2015/0217330 A1 * | 8/2015 | Haukka | C23C 16/02 | 427/343 |
| 2016/0343580 A1 * | 11/2016 | Hudson | H01J 37/32513 | |
| 2016/0365280 A1 * | 12/2016 | Brink | H01L 21/76897 | |
| 2017/0037513 A1 * | 2/2017 | Haukka | C23C 16/405 | |
| 2017/0062210 A1 * | 3/2017 | Visser | C23C 16/0227 | |
| 2017/0092533 A1 * | 3/2017 | Chakraborty | H01L 21/32 | |
| 2017/0133608 A1 * | 5/2017 | Fuse | B32B 9/00 | |
| 2017/0148640 A1 * | 5/2017 | Wang | H01L 21/02164 | |
| 2017/0194196 A1 * | 7/2017 | Brink | H01L 21/76897 | |
| 2017/0256402 A1 * | 9/2017 | Kaufman-Osborn | H01L 21/32 | |
| 2017/0323776 A1 * | 11/2017 | Farm | H01L 21/02189 | |
| 2017/0323781 A1 * | 11/2017 | Kachian | C23C 16/45525 | |
| 2018/0012752 A1 * | 1/2018 | Tapily | H01L 21/0228 | |
| 2018/0366317 A1 * | 12/2018 | Ke | H01L 21/0271 | |
| 2019/0043754 A1 * | 2/2019 | Brink | H01L 21/76897 | |
| 2019/0080904 A1 * | 3/2019 | Anthis | H01L 21/02334 | |
| 2019/0157079 A1 * | 5/2019 | Ke | C23C 16/56 | |
| 2019/0210061 A1 * | 7/2019 | Ke | B05D 3/0453 | |
| 2019/0316256 A1 * | 10/2019 | Bhuyan | H01L 21/3205 | |
| 2019/0326114 A1 * | 10/2019 | Kachian | H01L 21/02639 | |

* cited by examiner

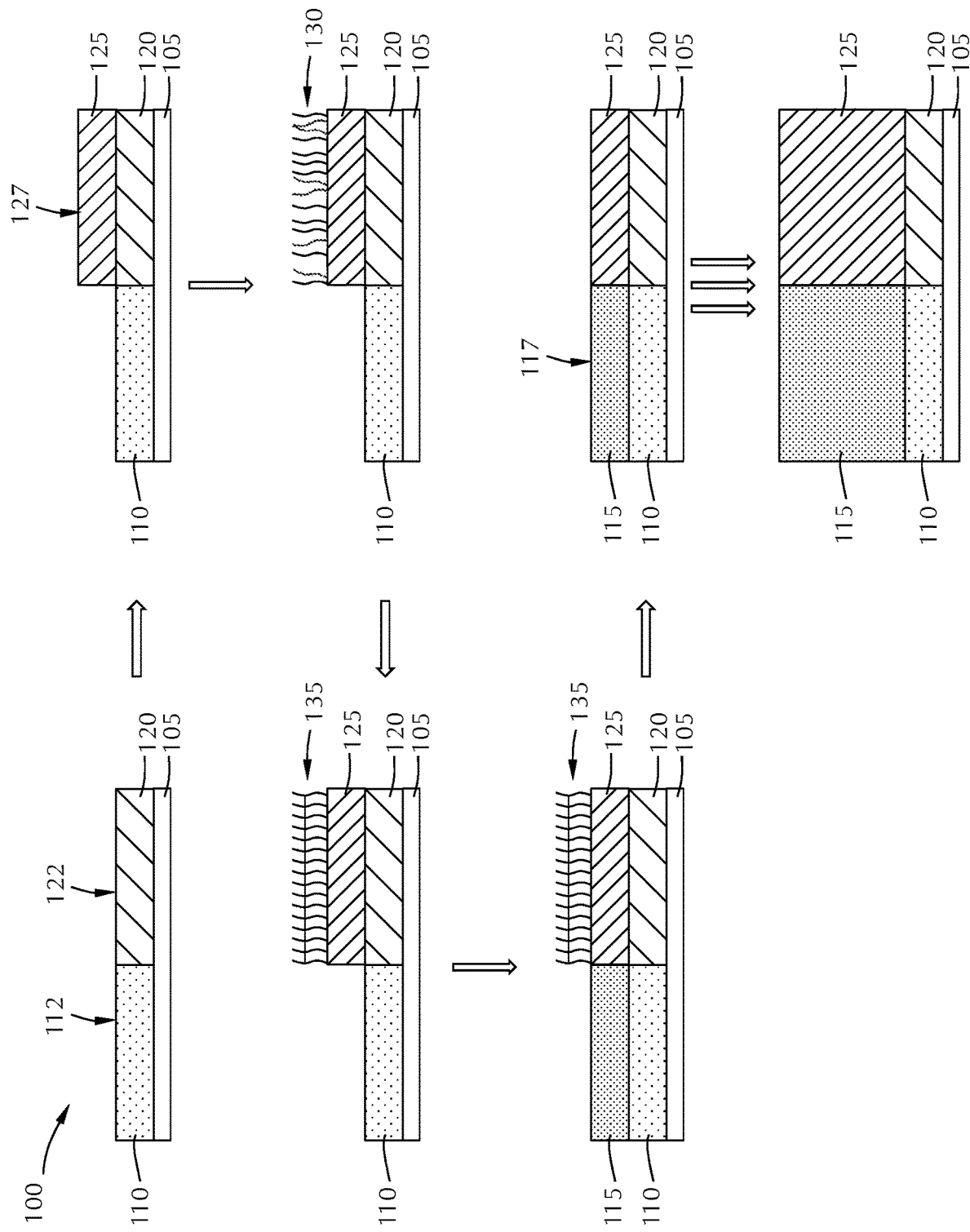

SELECTIVE DEPOSITION DEFECTS REMOVAL BY CHEMICAL ETCH

CROSS-REFERENCE TO RELATED APPLICATIONS

This application claims priority to U.S. Provisional Application No. 62/557,734, filed Sep. 12, 2017, the entire disclosure of which is hereby incorporated by reference herein.

FIELD

Embodiments of the disclosure generally relate to methods of enhancing selective deposition of a film using self-assembled monolayers. More particularly, embodiments of the disclosure are directed to methods of removing defects from selective deposition of a film by chemical etch.

BACKGROUND

The semiconductor industry faces many challenges in the pursuit of device miniaturization including the rapid scaling of nanoscale features. Such challenges include the fabrication of complex devices, often using multiple lithography and etch steps. Furthermore, the semiconductor industry needs low cost alternatives to high cost EUV for patterning complex architectures. To maintain the cadence of device miniaturization and keep chip manufacturing costs down, selective deposition has shown promise. It has the potential to remove costly lithographic steps by simplifying integration schemes.

Selective deposition of materials can be accomplished in a variety of ways. For instance, some processes may have inherent selectivity to surfaces based on their surface chemistry. These processes are fairly rare and usually need to have surfaces with drastically different surface energies, such as metals and dielectrics.

In cases where surfaces are similar ($SiO_2$ versus Si—H terminated or SiN) the surfaces may be selectively blocked by employing surface treatments that selectively react with one surface and not the other, effectively blocking any surface reactions during later ALD or CVD processes.

Self-Assembled Monolayer (SAM) is an approach to enable selective deposition on multiple material surfaces. Ideally, during the SAM passivation, SAM forms over all dielectrics surface perfectly, and block 100% metal oxide deposition from subsequent deposition steps so that metal oxide only grows on conductor/metal surface. However, the SAM monolayer grows in an asymptotic thickness as a function of deposition time and number of cycles so that achieving an ideal SAM that provides 100% blocking for the metal oxide is extremely difficult.

Additionally, excessive SAM precursor exposure on a densely packed SAM surface might lead to droplet defects. As a result, small amount of metal oxide might grow on SAM passivated surfaces, leaves many small metal oxide defects. Such metal oxide defects might impact subsequent SAM removal and mask removal processes.

Therefore, there is a need in the art for methods to remove defects formed as part of a SAM protected selective deposition process.

SUMMARY

One or more embodiments of the disclosure are directed to methods of selectively depositing a film. A substrate with a first material with a first surface and a second material with a second surface is provided. The substrate is exposed to a blocking compound comprising at least one blocking molecule to selectively deposit a blocking layer on the first surface relative to the second surface. A layer is selectively formed on the second surface relative to the first surface and defects comprising the layer are created on the blocking layer on the first surface. The defects are removed from the blocking layer on the first surface.

Additional embodiments of the disclosure are directed to methods of selectively depositing a film. A substrate with a first material comprising a dielectric with a first surface and a second material comprising a conductor with a second surface is provided. The substrate is exposed to a blocking compound comprising at least one blocking molecule to selectively deposit a blocking layer on the first surface relative to the second surface. A layer is selectively formed on the second surface relative to the first surface and forming defects of the layer on the blocking layer. The substrate is exposed to a defect removal process for a predetermined amount of time to remove the defects from the blocking layer. The defect removal process comprises a metal-halogen precursor.

Further embodiments of the disclosure are directed to methods of selectively depositing a film. A substrate with a first material comprising a dielectric and a second material comprising a conductor is provided. The substrate is exposed to a blocking compound comprising at least one blocking molecule to selectively deposit a blocking layer on the dielectric relative to the conductor. A layer is selectively formed on the conductor relative to the dielectric. Forming the layer causes defects to grow on the blocking layer. The substrate is exposed to a defect removal process for a predetermined amount of time to remove the defects from the blocking layer. The defect removal process comprises exposure to a metal-halogen precursor comprising one or more of $WCl_x$, $HfCl_x$, $NbCl_x$ or $RuCl_x$, where x is 1 to 6, or a metal oxyhalide in a thermal process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The FIGURE illustrates a processing method in accordance with one or more embodiment of the disclosure.

DETAILED DESCRIPTION

One or more embodiments of the disclosure provide dry chemical etch methods to efficiently remove defects from SAM promoted selective deposition. Some embodiments of the disclosure advantageously provide methods for process integration to improve selective deposition processes. Some embodiments advantageously provide methods for improving SAM or mask removal processing.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface may comprise a metal, metal oxide, or H-terminated $Si_xGe_{1-x}$, and the second substrate surface may comprise a Si-containing dielectric, or vice versa. In some embodiments, a substrate surface may comprise certain functionality (e.g., —OH, —NH, etc.).

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

In recent decades, the semiconductor community has made attempts to improve integrated circuit (IC) processing by replacing lithography steps with alternatives that translate to lower cost, reduced processing time, and smaller feature sizes. Many of these alternatives fall under the blanket category of "selective deposition." In general, selective deposition refers to a process for which the net deposition rate is higher on the target substrate material relative to other substrate materials, such that the desired film thickness is achieved on the target substrate material with less or negligible deposition on the other substrate materials (where "negligible" is defined by process constraints).

Embodiments of the disclosure incorporate a blocking layer typically referred to as a self-assembled monolayer (SAM). A self-assembled monolayer (SAM) consists of an ordered arrangement of spontaneously assembled organic molecules adsorbed on a surface. These molecules are typically comprised of one or more moieties with an affinity for the substrate (head group) and a relatively long, inert, linear hydrocarbon moiety (tail group).

In this case, SAM formation happens through fast adsorption of molecular head groups at the surface and slow association of molecular tail groups with each other through van der Waals interactions. SAM precursors are chosen such that the head group selectively reacts with the substrate materials to be blocked during deposition. Deposition is then performed, and the SAMs can be removed through thermal decomposition (with desorption of any byproducts) or an integration-compatible ashing process. Successful selective deposition through this idealized formation and use of SAMs has been demonstrated for a number of systems; however, success is essentially limited to a solution-based approach for SAM formation (i.e., wet functionalization). Wet functionalization approaches are not only incompatible with vacuum-based integration schemes but also often require sonication post-SAM formation to eliminate physisorbed SAM precursor. This suggests successful selective SAM formation (on one substrate versus another) cannot rely on the functionalization process alone to yield the overall selective chemisorption result with no physisorption.

Referring to the FIGURE, one or more embodiment of the disclosure is directed to a processing method 100 for selective deposition. A substrate 105 is provided with a first material 110 and a second material 120. The first material 110 has a first surface 112 and the second material 120 has a second surface 122.

In some embodiments, the first material comprises a metal oxide or a dielectric material and the second material comprises a metal or silicon. In some embodiments, the first material consists essentially of silicon oxide.

In some embodiments, the second material comprises a metal oxide or a dielectric material and the first material comprises a metal or silicon. In some embodiments, the second material consists essentially of silicon oxide.

As used in this specification and the appended claims, the term "consists essentially of" means that greater than or equal to about 95%, 98% or 99% of the specified material is the stated material.

The first surface 112 is exposed to a blocking compound to selectively deposit a blocking layer 130 on the first surface 112 over the second surface 122. The blocking layer is exposed to a polymer initiator to form a networked blocking layer 135. The blocking compound comprises at least one blocking molecule. A blocking molecule has the general formula A-L-Z, where A is a reactive head group, L is a linking group and Z is a reactive tail group.

As used in this manner, the "head group" is a chemical moiety that associates with the first surface 112 and the "tail group" is a chemical moiety that extends away from the first surface 112.

In some embodiments, the first material comprises a metal oxide or a dielectric material and A is selected from the group consisting of $(R_2N)_{(3-a)}R'_aSi—$, $X_3Si—$ and $(RO)_3Si—$, where each R and R' is independently selected from C1-C6 alkyl, C1-C6 cycloakyl and C1-C6 aryl, a is an integer from 0 to 2, and each X is independently selected from halogens.

In some embodiments, the first material comprises a metal or silicon and A is selected from the group consisting of $(HO)_2OP—$, $HS—$ and $H_3Si—$.

Some of the reactive head groups listed above comprise more than one reactive moiety in a single reactive head group (e.g. $H_3Si—$ may bond up to three times with the surface) which is attached to linking group, L. In some embodiments, A is selected from reactive groups where less than the number of reactive moieties listed above and are attached to more than one linking group, L. In these embodiments, the linking groups may be the same or different. In these embodiments, the tail groups may be the same or different.

The blocking compound can be delivered to the substrate as a single compound or sequential exposures of multiple compounds to form a blocking layer 130. In some embodiments, the first surface 112 is exposed to a single compound that assembles on the surface in an ordered or semi-ordered manner.

In some embodiments, L is —$(CH_2)_n$— and n is an integer from 4 to 18. In some embodiments, the linking group may be branched. In some embodiments, the linking group may be substituted. In some embodiments, the linking group may be unsaturated. In some embodiments, the linking group may comprise cycloalkyl or aryl groups.

In some embodiments, the linking group L comprises less than 18 carbon atoms. In some embodiments, the linking group comprises less than 17, 16, 15, 14, 13, 12, 11, 10, 9, 8, 7, 6, or 5 carbon atoms.

In some embodiments, Z is a group comprising one or more reactive moiety selected from alkenes, alkynes, alcohols, carboxylic acids, aldehydes, acyl halides, amines, amides, cyanates, isocyanates, thiocyanates, isothiocyanates, or nitriles.

In some embodiments, the blocking molecule comprises more than one reactive moiety. In some embodiments, A is linked to more than one linking group each terminated with a reactive tail group, such that a blocking molecule comprises more than one reactive moiety. In some embodiments, L is branched, such that a blocking molecule comprises more than one reactive moiety.

In some embodiments, the blocking molecule comprises more than one reactive moiety and the reactive moieties are positioned in a linear fashion. In some embodiments, Z comprises more than one reactive moiety and the reactive moieties are positioned in a branched fashion.

As used in this manner, reactive moieties positioned in a linear fashion are positioned within a blocking molecule such than they are positioned within the same carbon chain. In other words, they are positioned end-to-end. As used in this manner, reactive moieties positioned in a branched fashion are positioned within a blocking molecule such than they are positioned on different carbon chains. In other words, they are not positioned end-to-end. In some embodiments, the reactive moieties may be separated by intervening atoms but still be considered end-to-end.

For example, Compound I contains one reactive moiety. Compounds II and III contain two reactive moieties. Compound II has reactive moieties positioned in a linear fashion. Compound III has reactive moieties positioned in a branched fashion.

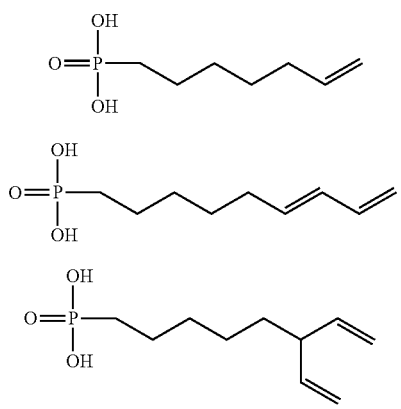

In some embodiments, the tail groups associate with each other through relatively slow van der Waals interaction. In some embodiments, the tail groups can be the same or different so that a homogeneous or heterogeneous SAM can be formed. In some embodiments, the blocking compound comprises at least two different blocking molecules so that a heterogenous SAM is formed.

In some embodiments, the blocking layer 130 is exposed to a polymer initiator to form the networked blocking layer 135. The polymer initiator can be any suitable process including, but not limited to, a chemical reaction, UV light exposure, electron beam exposure and/or heat. In some embodiments, the polymer initiator comprises one or more of radiation treatment, thermal treatment, plasma treatment or chemical treatment. In some embodiments, the radiation treatment comprises exposing the blocking layer to UV-visible radiation in the range of about 150 nm to about 900 nm. In some embodiments, the thermal treatment comprises annealing the substrate to react the blocking molecules. In some embodiments, the plasma treatment comprises plasmas generated from a remote plasma source, a direct plasma source, microwave plasma or a combination of these sources. In some embodiments, the chemical treatment comprises exposing the blocking layer to one or more chemical reactants. In some embodiments, the polymer initiator consists essentially of radiation treatment or thermal treatment. In these embodiments, the networked blocking layer is not formed by exposing the blocking layer to a chemical reactant.

In some embodiments, the polymer initiator comprises a chemical treatment comprising a radical initiator selected from peroxides, organometallic complexes, or azobisisobutyronitrile (AIBN). Without being bound by theory, in these embodiments, the blocking layer forms a networked blocking layer through radical polymerization. In some embodiments, the chemical treatment comprises exposing the blocking layer to a chemical reactant with multiple functional groups. In some embodiments, the chemical treatment comprises exposing the blocking layer to an amine or an alcohol with multiple functional groups.

Without being bound by theory, reactions of reactive groups with a polymer initiator form a networked blocking layer. For example, reaction of alkenes or alkynes with UV, thermal, chemical reactants or plasma may produce carbon based polymers. The reaction of carboxylic acids, aldehydes or acyl halides with amines may produce polyamides. The reaction of isocyanato groups with alcohols may produce polyurethanes. The reaction of carboxylic acids, aldehydes or acyl halides with alcohols may produce polyesters.

After formation of a blocking layer (either networked or non-networked), a layer 125 is selectively formed on the second surface 122 of the second material 120 over the networked blocking layer 135. The blocking layer provides a protecting group to prevent or minimize deposition of the layer 125 on the first surface 112. In some embodiments, the layer 125 is a different material than the second material 120. In some embodiments, the layer 125 is the same material as the second material 120.

Without being bound by theory, the gas phase reaction of the blocking compound with the substrate is facilitated by blocking molecules with higher volatility or higher vapor pressure. In some embodiments, the blocking compound has a vapor pressure greater than or equal to about 0.1 mm Hg at 25° C., 0.2 mm Hg at 25° C., 0.3 mm Hg at 25° C., 0.4 mm Hg at 25° C., 0.5 mm Hg at 25° C., 0.6 mm Hg at 25° C., 0.7 mm Hg at 25° C., 0.8 mm Hg at 25° C., 0.9 mm Hg at 25° C., 1 mm Hg at 25° C., 5 mm Hg at 25° C., 10 mm Hg at 25° C., 50 mm Hg at 25° C., 100 mm Hg at 25° C., 200 mm Hg at 25 ° C., 300 mm Hg at 25° C., 400 mm Hg at 25° C. or 500 mm Hg at 25° C.

In some embodiments, after selective deposition of the layer 125 on the second material 120, the blocking layer is removed from the first surface. In some embodiments, the blocking layer is removed from the surface by oxidation. In some embodiments, the blocking layer is etched from the surface. In some embodiments, the blocking layer is dissolved in a suitable solvent (e.g., ethanol).

In some embodiments, a substrate contains both conductor and dielectrics surface, and a SAM passivation is formed, followed by metal oxide deposition. Metal oxide defects are formed on the SAM surface (i.e., the blocking layer), while a continuous metal oxide is deposited on conductor surface.

In some embodiments, the defects formed on the SAM surface are removed by a defect removal process. In the defect removal process, the substrate is exposed to a metal and halogen containing precursor, which etches away the metal oxide defects by forming volatile byproduct. A majority or all metal oxide defects can be removed by this method.

In some embodiments, the defect removal process is a thermal process. As used in this manner, a thermal process does not expose the substrate to a plasma or remote plasma.

In some embodiments, the metal-halogen precursor also etches the continuous metal oxide layer. While the metal-halogen precursor also etches the continuous metal oxide layer, the film etch rate of the metal oxide layer is lower due to less exposure surface area, compared to defects with the same height. Metal etching on a smooth continuous metal oxide layer may have minimum or no impact on the underlying conductor.

Suitable metal-halogen precursors for defect removal include, but are not limited to, WClx, HfClx, NbClx, RuClx, where x ranges from 1 to 6. In some embodiments, the metal-halogen precursor comprises an oyxhalide (e.g., WOCl$_4$). In some embodiments, the metal-halogen precursor comprises substantially no fluorine. As used in this manner, the term "substantially no fluorine" means that the halogen content of the metal-halogen precursor is less than or equal to about 5%, 2% or 1% fluorine on an atomic basis.

The substrate temperature during the defect removal process can be in the range of about 150 C. to about 550 C. In some embodiments, the substrate temperature is in the range of about 300 C. to about 500 C.

In some embodiments, the defect removal process comprises an isotropic etch process. The isotropic etch process is controlled by the amount of time that the substrate is exposed to the metal-halogen precursor. In some embodiments, removal of the defects comprises exposing the substrate to the metal-halogen precursor for a pre-determined amount of time.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selective deposition comprising:
   providing a substrate with a first material with a first surface and a second material with a second surface;
   exposing the substrate to a blocking compound comprising at least one blocking molecule to selectively deposit a blocking layer on the first surface relative to the second surface;
   forming a layer selectively on the second surface relative to the first surface and creating defects comprising the layer on the first surface; and
   removing the defects from the blocking layer on the first surface.

2. The method of claim 1, wherein removing the defects from the first surface comprises exposing the substrate to a metal-halogen precursor for a predetermined amount of time.

3. The method of claim 2, wherein the metal-halogen precursor comprises one or more of $WCl_x$, $HfCl_x$, $NbCl_x$ or $RuCl_x$, where x is 1 to 6.

4. The method of claim 2, wherein the metal-halogen precursor comprises a metal oxyhalide.

5. The method of claim 2, wherein the metal-halogen precursor comprises substantially no fluorine atoms.

6. The method of claim 2, wherein removing the defects comprises a thermal process.

7. The method of claim 1, wherein the first material comprises a metal oxide or a dielectric material and the second material comprises a metal or silicon.

8. The method of claim 6, wherein the first material consists essentially of silicon oxide.

9. The method of claim 1, wherein the second material comprises a metal oxide or a dielectric material and the first material comprises a metal or silicon.

10. The method of claim 8, wherein the second surface consists essentially of silicon oxide.

11. The method of claim 1, wherein the layer comprises a metal oxide.

12. The method of claim 11, wherein the metal oxide is an etch stop layer or a mask layer.

13. The method of claim 1, wherein the blocking molecule comprises more than one reactive moiety.

14. The method of claim 13, wherein the reactive moieties are positioned in a linear fashion.

15. The method of claim 13, wherein the reactive moieties are positioned in a branched fashion.

16. The method of claim 1, wherein the blocking compound comprises at least two different blocking molecules.

17. A method of selective deposition comprising:
   providing a substrate with a first material comprising a dielectric with a first surface and a second material comprising a conductor with a second surface;
   exposing the substrate to a blocking compound comprising at least one blocking molecule to selectively deposit a blocking layer on the first surface relative to the second surface;
   forming a layer selectively on the second surface relative to the first surface and forming defects of the layer on the blocking layer; and
   exposing the substrate to a defect removal process for a predetermined amount of time to remove the defects from the blocking layer, the defect removal process comprising a metal-halogen precursor.

18. The method of claim 17, wherein the metal-halogen precursor comprises one or more of $WCl_x$, $HfCl_x$, $NbCl_x$ or $RuCl_x$, where x is 1 to 6, or a metal oxyhalide.

19. The method of claim 2, wherein removing the defects comprises a thermal process.

20. A method of selective deposition comprising:
providing a substrate with a first material comprising a dielectric and a second material comprising a conductor;
exposing the substrate to a blocking compound comprising at least one blocking molecule to selectively deposit a blocking layer on the dielectric relative to the conductor;
forming a layer selectively on the conductor relative to the dielectric, where forming the layer causes defects to grow on the blocking layer; and
exposing the substrate to a defect removal process for a predetermined amount of time to remove the defects from the blocking layer, the defect removal process comprising exposure to a metal-halogen precursor comprising one or more of $WCl_x$, $HfCl_x$, $NbCl_x$ or $RuCl_x$, where x is 1 to 6, or a metal oxyhalide in a thermal process.

* * * * *